US012677449B2

(12) United States Patent
Lin et al.

(10) Patent No.: US 12,677,449 B2
(45) Date of Patent: Jul. 7, 2026

(54) SEMICONDUCTOR DEVICE AND MANUFACTURING METHOD THEREOF

(71) Applicant: PANJIT INTERNATIONAL INC., Kaohsiung (TW)

(72) Inventors: Che-Ming Lin, New Taipei (TW); Jong Ho Park, Kaohsiung (TW); Kwang Yeon Jun, New Taipei (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 842 days.

(21) Appl. No.: 17/748,068

(22) Filed: May 19, 2022

(65) Prior Publication Data

US 2023/0378254 A1     Nov. 23, 2023

(51) Int. Cl.
| | |
|---|---|
| *H10D 62/10* | (2025.01) |
| *H01L 21/265* | (2006.01) |
| *H01L 21/761* | (2006.01) |
| *H01L 21/765* | (2006.01) |
| *H10D 64/00* | (2025.01) |
| *H10P 30/20* | (2026.01) |
| *H10W 10/00* | (2026.01) |
| *H10W 10/30* | (2026.01) |
| *H10W 10/50* | (2026.01) |

(52) U.S. Cl.
CPC ......... *H10D 62/111* (2025.01); *H10D 64/111* (2025.01); *H10P 30/204* (2026.01); *H10P 30/21* (2026.01); *H10W 10/031* (2026.01); *H10W 10/051* (2026.01); *H10W 10/30* (2026.01); *H10W 10/50* (2026.01)

(58) Field of Classification Search
CPC ............. H01L 29/0619; H01L 29/0623; H01L 29/739; H10D 64/111; H10D 64/112; H10D 84/83–859; H10D 30/021–0415; H10D 30/60–798; H10D 62/111; H10D 62/106; H10D 62/107; H10D 30/665; H10D 12/415; H10D 62/109; H10D 62/054; H10W 10/031; H10W 10/051; H10W 10/30; H10W 10/50
See application file for complete search history.

(56) References Cited

U.S. PATENT DOCUMENTS

| | | | |
|---|---|---|---|
| 2011/0018101 A1* | 1/2011 | Omori .................. | H10D 62/111 257/548 |
| 2017/0098705 A1* | 4/2017 | Harrington, III ... | H01L 29/0696 |
| 2018/0294333 A1* | 10/2018 | Weber ................... | H01L 21/266 |
| 2019/0348318 A1 | 11/2019 | Sakata et al. | |

\* cited by examiner

*Primary Examiner* — Leonard Chang
*Assistant Examiner* — Stanetta D Isaac

(57) ABSTRACT

A semiconductor device and a manufacturing method thereof are provided. The manufacturing method includes steps of: depositing an N-drift layer on a substrate, conducting an ion implant process on the N-drift layer to form a plurality of P-type pillars, depositing a N-type epitaxial layer on the P-type pillars, conducting an ion implant process on the N-type epitaxial layer to form a first P-type epitaxial layer and at least one localized P region, conducting a field oxidation to the first P-type epitaxial layer to form a second P-type epitaxial layer, and forming a field oxide layer on the first P-type epitaxial layer and the N-type epitaxial layer. The localized P region passes though the N-type epitaxial layer to the field oxide layer.

9 Claims, 13 Drawing Sheets

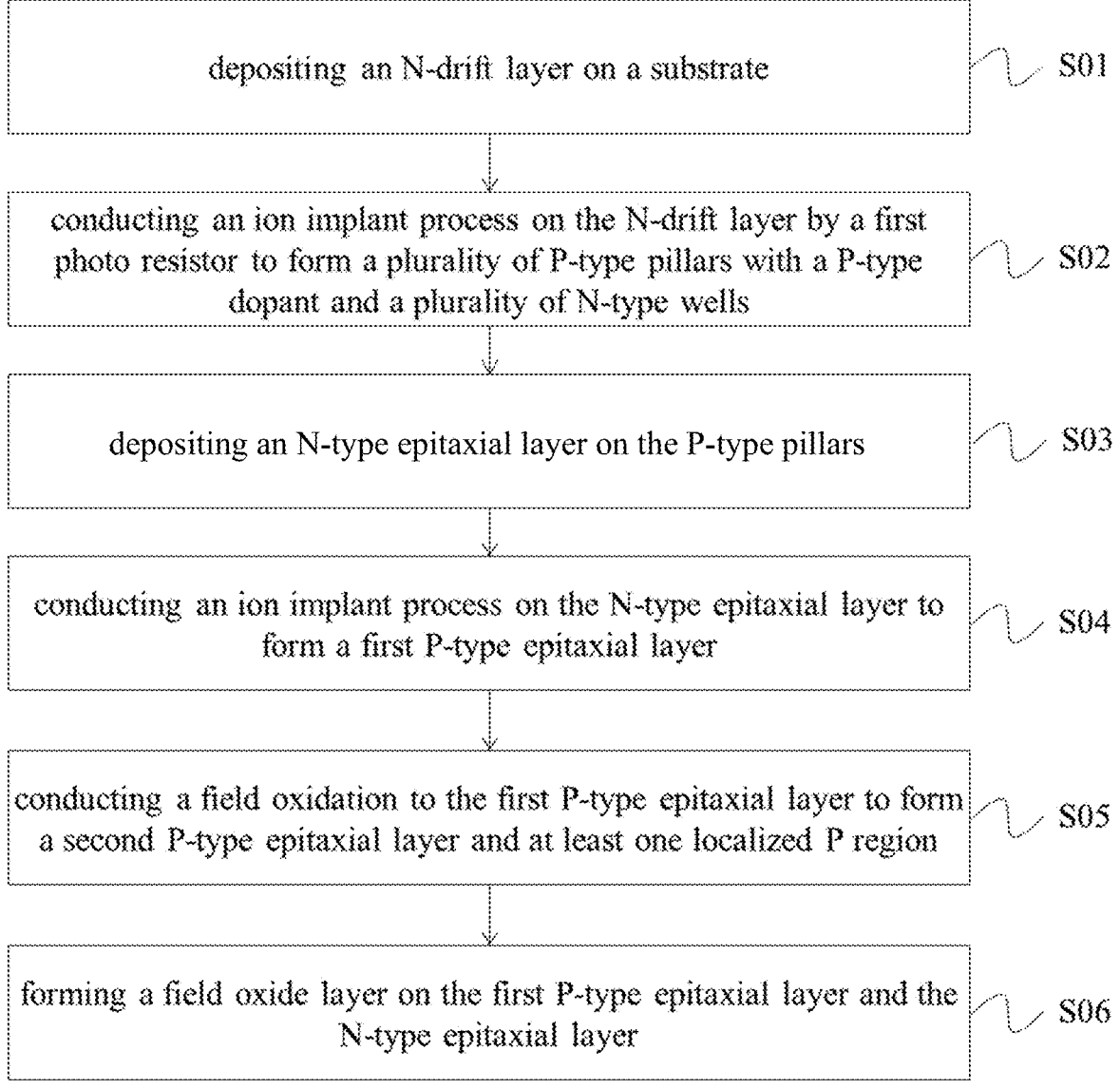

depositing an N-drift layer on a substrate    S01 conducting an ion implant process on the N-drift layer by a first photo resistor to form a plurality of P-type pillars with a P-type dopant and a plurality of N-type wells    S02 depositing an N-type epitaxial layer on the P-type pillars    S03 conducting an ion implant process on the N-type epitaxial layer to form a first P-type epitaxial layer    S04 conducting a field oxidation to the first P-type epitaxial layer to form a second P-type epitaxial layer and at least one localized P region    S05 forming a field oxide layer on the first P-type epitaxial layer and the N-type epitaxial layer    S06

FIG. 1

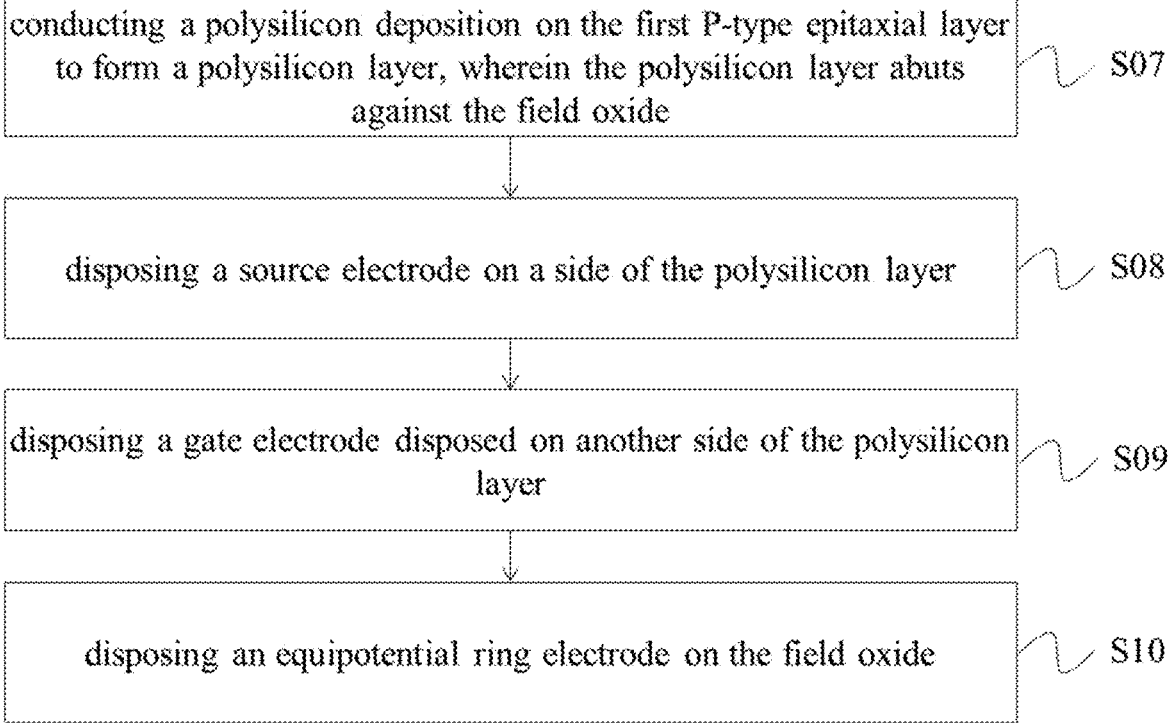

conducting a polysilicon deposition on the first P-type epitaxial layer to form a polysilicon layer, wherein the polysilicon layer abuts against the field oxide                    S07 disposing a source electrode on a side of the polysilicon layer          S08 disposing a gate electrode disposed on another side of the polysilicon layer          S09 disposing an equipotential ring electrode on the field oxide          S10

FIG. 2 conducting the ion implant process on the N-drift layer to form a plurality of P-type regions ⟶ S021 depositing an N-type layer on the P-type regions ⟶ S022 conducting the ion implant process on the N-type layer to form a plurality of P-type regions ⟶ S023 repeating steps S022 and S023 for at least one time ⟶ S024 conducting a field oxidation to the P-type regions to form the P-type pillars ⟶ S025

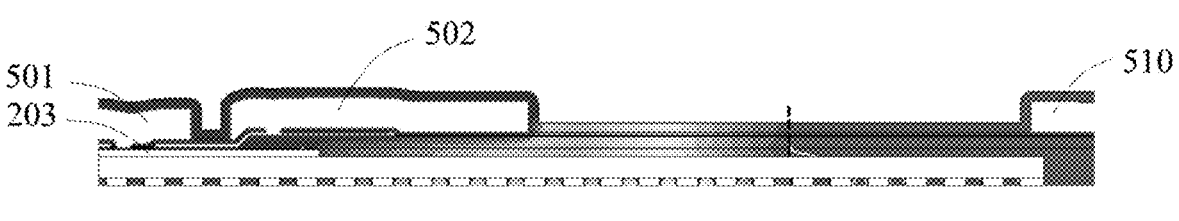
FIG. 19A
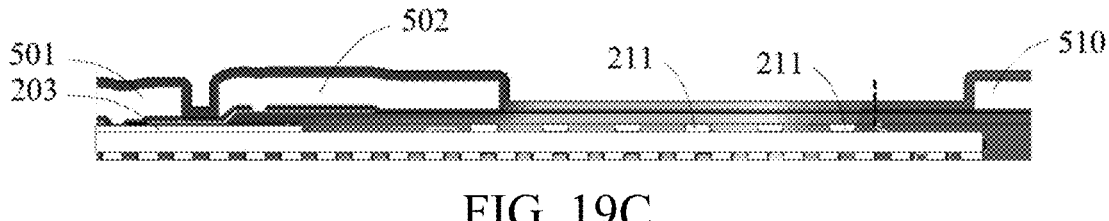
FIG. 19B
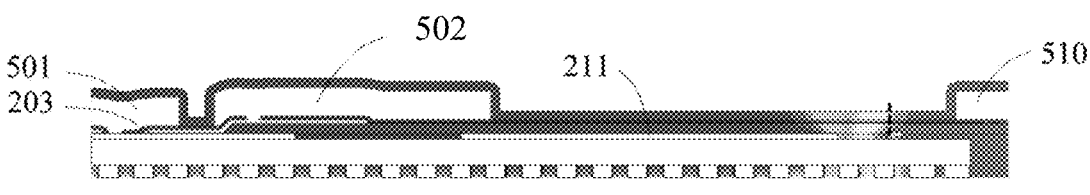
FIG. 19C
FIG. 19D

SEMICONDUCTOR DEVICE AND MANUFACTURING METHOD THEREOF

BACKGROUND OF THE INVENTION

1. Field of the Invention

The present invention generally relates to a semiconductor device and a manufacturing method thereof, and in particular, to the semiconductor device having localized P regions in a termination area for extension of surface electric field and enhancing breakdown voltage.

2. Description of the Related Art

In the conventional high-voltage power semiconductor device, the termination area surrounds the active area and works in an adequately high breakdown voltage. The depletion extension width in the termination area would affect electric field distribution of the termination area. In order to achieve a uniform electric field distribution, the conventional termination area requires complicated manufacturing processes to form a plurality of stacked layers and have to occupy a large portion of a chip area. Additional ion implantation process is also required which greatly increases manufacturing costs. Therefore, the conventional manufacturing process still has some considerable problems.

As the technology of the high-voltage power semiconductor device develops, the breakdown voltage is getting much higher as more semiconductor components are integrated per chip. The capability of extension of surface electric field will directly decide the device performance of the high-voltage power semiconductor device. When using the conventional structure of the termination area, the surface electric field is narrow and fails to achieve the desired performance.

In summary, the conventional manufacturing method to the power semiconductor device still has considerable problems. Hence, the present disclosure provides the manufacturing method of a semiconductor device to resolve the shortcomings of conventional technology and promote industrial practicability

SUMMARY OF THE INVENTION

In view of the aforementioned technical problems, the primary objective of the present disclosure is to provide a manufacturing method of a semiconductor device and the structure of the semiconductor device, which are capable of extending surface electric field and enhancing breakdown voltage in a low cost.

In accordance with one objective of the present disclosure, a manufacturing method of a semiconductor device is provided. The manufacturing method includes steps of: depositing an N-drift layer on a substrate; conducting an ion implant process on the N-drift layer to form a plurality of P-type pillars; depositing an N-type epitaxial layer on the P-type pillars; conducting an ion implant process on the N-type epitaxial layer to form a first P-type epitaxial layer and at least one localized P region; conducting a field oxidation to the first P-type epitaxial layer to form a second P-type epitaxial layer; and forming a field oxide layer on the first P-type epitaxial layer and the N-type epitaxial layer; wherein the localized P region passes though the N-type epitaxial layer to the field oxide layer.

Preferably, the step of conducting the ion implant process on the N-drift layer to form the plurality of P-type pillars includes a step of: conducting the ion implant process on the N-drift layer to form a plurality of P-type regions.

Preferably, the step of conducting the ion implant process on the N-drift layer to form the plurality of P-type pillars further includes steps of: (a) depositing an N-type layer on the P-type regions; (b) conducting the ion implant process on the N-type layer to form the plurality of P-type regions; (c) repeating steps (a)-(b) for at least one time; (d) conducting a field oxidation to the P-type regions to form the P-type pillars.

Preferably, the localized P region is formed on the second P-type epitaxial layer along a longitudinal direction of one of the P-type pillars.

Preferably, each of the localized P region is spaced apart from each other.

Preferably, a ratio of the localized P region to the P-type pillars is 1:3-100.

Preferably, the manufacturing method further includes a step of electrically conducting the semiconductor device, wherein a peak of a surface electric field of the semiconductor device is approximately equal to or less than $2.1 \times 10^5$ V/cm.

Preferably, the manufacturing method further includes a step of electrically conducting the semiconductor device, wherein a breakdown voltage of the semiconductor device is approximately equal to or greater than 1.05 times to device sustained breakdown voltage rating.

Preferably, the manufacturing method further includes steps of: conducting a polysilicon deposition on the first P-type epitaxial layer to form a polysilicon layer, wherein the polysilicon layer abuts against the field oxide; disposing a source electrode on a side of the polysilicon layer; disposing a gate electrode disposed on another side of the polysilicon layer; and disposing an equipotential ring electrode on the field oxide.

In accordance with one objective of the present disclosure, a semiconductor device is provided. The semiconductor device is provided with an N-drift layer including a plurality of P-type pillars each disposed on the N-drift layer; a second P-type epitaxial layer disposed on the P-type pillars; an N-type epitaxial layer disposed on the second P-type epitaxial layer; a first P-type epitaxial layer disposed on and abutting against the N-type epitaxial layer; a field oxide layer disposed on the first P-type epitaxial layer and the N-type epitaxial layer; and at least one localized P region disposed on the P-type pillars and passes though the N-type epitaxial layer to the field oxide layer.

Preferably, the localized P region is configured to extend a depletion boundary of a surface electric field of the semiconductor device.

Preferably, the localized P region is disposed on the second P-type epitaxial layer along a longitudinal direction of one of the P-type pillars.

Preferably, each of the localized P region is spaced apart from each other.

Preferably, a ratio of the localized P region to the P-type pillars is 1:3-100.

Preferably, a peak of a surface electric field of the semiconductor device is approximately equal to or less than $2.1 \times 10^5$ V/cm.

Preferably, a breakdown voltage of the semiconductor device is approximately equal to or greater than 1.05 times to device sustained breakdown voltage rating.

Preferably, the semiconductor device further includes a substrate including an active area and a termination area that defines the active area, wherein the N-drift layer is disposed on the termination area.

Preferably, the semiconductor device further includes a polysilicon layer disposed on the first P-type epitaxial layer, wherein the polysilicon layer abuts against the field oxide; a source electrode disposed on a side of the polysilicon layer; a gate electrode disposed on another side of the polysilicon layer; and an equipotential ring electrode disposed on the field oxide.

In summary, the beneficial effects of the present disclosure are as follows: the semiconductor device and the manufacturing method of the present disclosure are provided a termination area in which a localized P region is disposed and passes through an N-type epitaxial layer to a field oxide layer. Owing to the localized P region, the semiconductor device of the present disclosure is capable of extending a depletion boundary of a surface electric field of the semiconductor device and reducing peaks of the surface electric field, thereby achieving a uniform electric field distribution and increasing breakdown voltage. The reverse blocking voltage capability is also increased. More robust to high temperature reverse bias reliability test due to lower surface electric field. Because the electric potential distribution is related to the electric field, the electric potential distribution width of the semiconductor device of the present disclosure is increased. Lower surface electric field can gain greater immunity to the technology processes so the stability of the semiconductor device of the present disclosure is increased. The localized P region can be well controlled by various pattern to achieve the desired performance. Moreover, the localized P region can be formed by reusing the photoresist without using any additional photoresist, which omits manufacturing costs.

BRIEF DESCRIPTION OF THE DRAWINGS

The technical features, detailed structures, advantages and effects of the present disclosure will be described in more details hereinafter with reference to the accompanying drawings that show various embodiments of the invention as follows.

FIGS. 1-3 are flowcharts for illustrating a manufacturing method of a semiconductor device in accordance with the embodiment of the present disclosure.

FIGS. 19A-19D are schematic diagrams illustrating a depletion boundary at the surface electric field of the power semiconductor devices in accordance with some embodiment of the present disclosure.

DETAILED DESCRIPTION OF THE PREFERRED EMBODIMENTS

Figure 3:
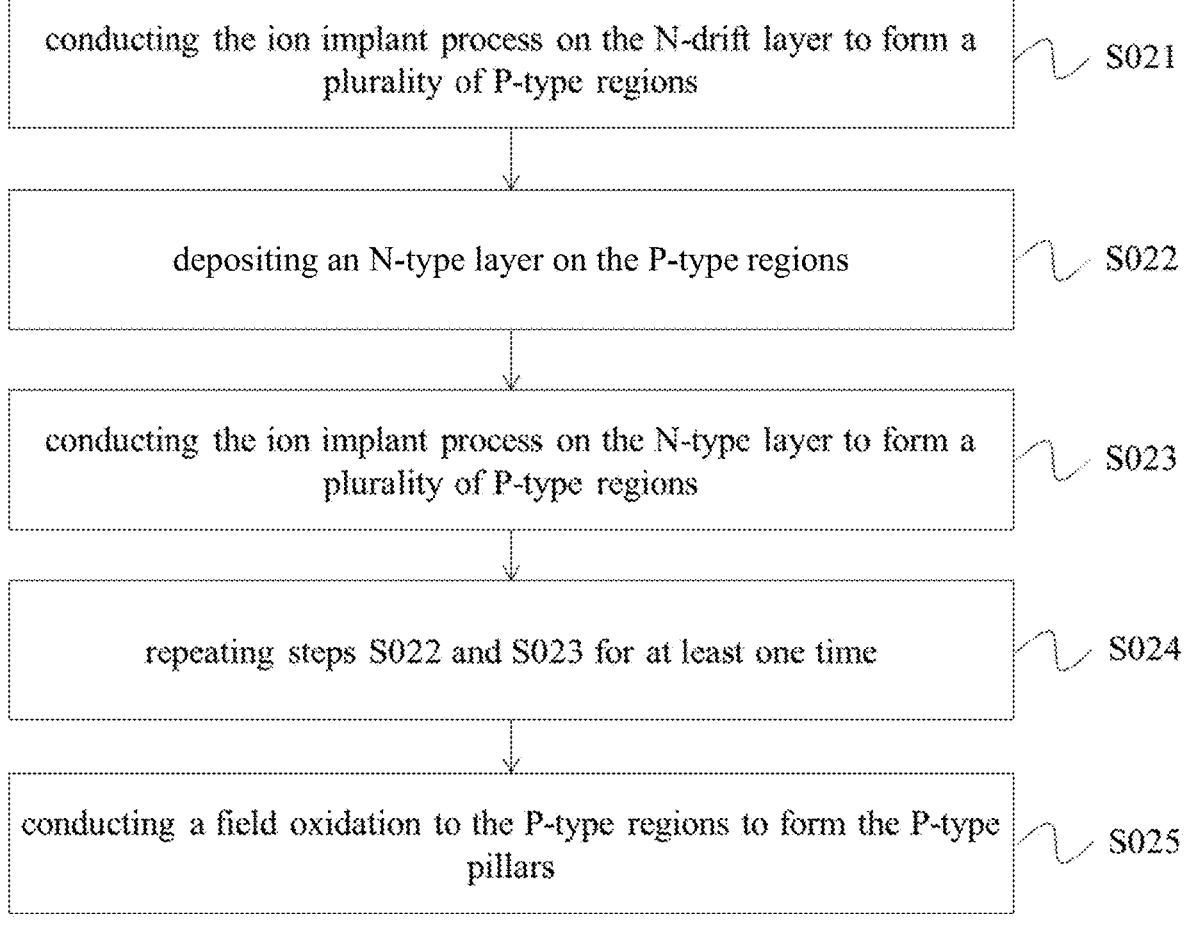

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on." "directly connected to" or "directly coupled to" another element or layer, there are no intervening elements or layers present.

Please refer to FIGS. 1-3 together with FIGS. 7-18. FIGS. 1-3 are flowcharts for illustrating a manufacturing method of a semiconductor device in accordance with the embodiment of the present disclosure. FIGS. 7-18 are schematic diagrams of the processes of manufacturing the semiconductor device.

As shown in FIG. 1, the present disclosure provides a manufacturing method of a semiconductor device and includes the following steps.

Figure 7:
FIGS. 7-18 are schematic diagrams of the processes of manufacturing the semiconductor device in accordance with the embodiment of the present disclosure.

Step S01: depositing an N-drift layer 101 on a substrate 100, as shown in FIG. 7.

Figure 14:
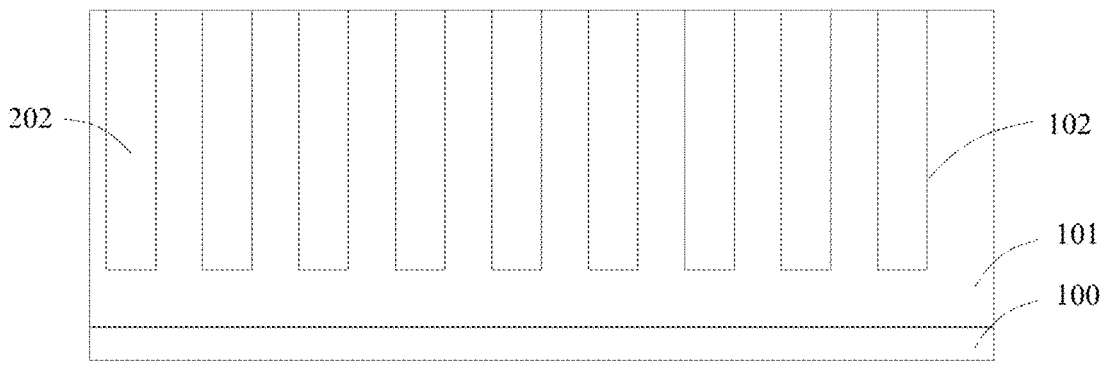

Step S02: conducting an ion implant process on the N-drift layer 101 by a first photoresist 301 to form a plurality of P-type pillars 201, 202 with a P-type dopant, as shown in FIG. 14. Examples of P-type dopants are boron, gallium, etc.

In an embodiment of the present disclosure, the step S02 further includes the following steps.

Figure 8:
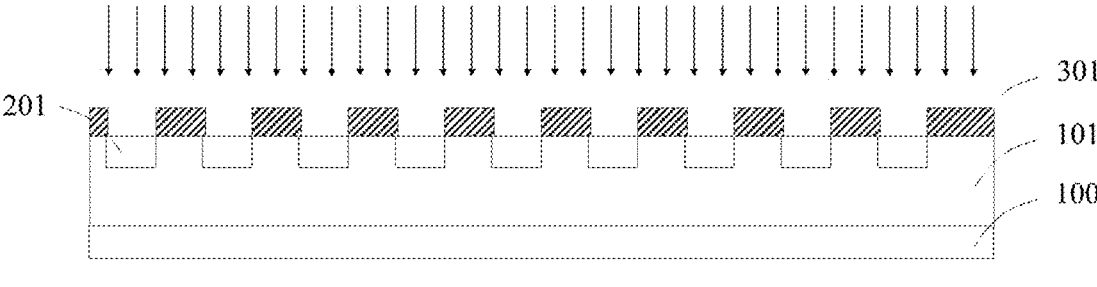
Figure 9:
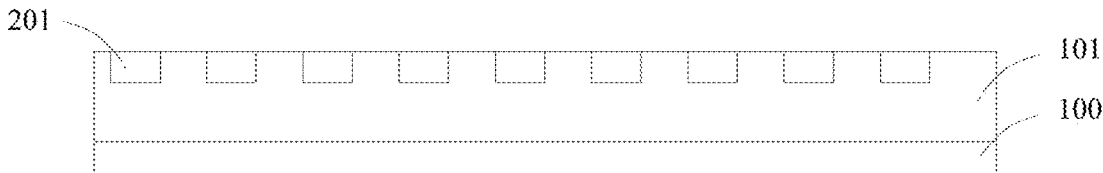

Step S021: conducting the ion implant process on the N-drift layer 101 to form a plurality of P-type regions 201, as shown in FIG. 8-9.

Figure 10:
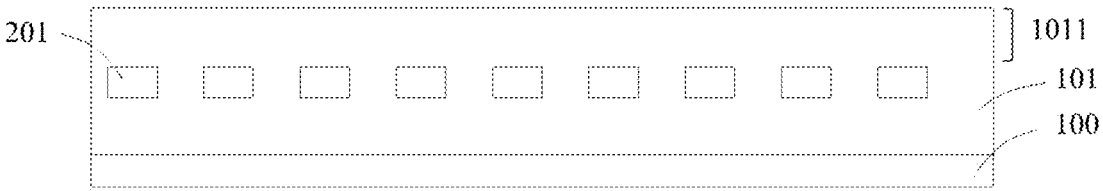

Step S022: depositing an N-type layer 1011 on the P-type regions 201, as shown in FIG. 10. Examples of N-type dopants are arsenic, phosphorus, etc.

Figure 11:
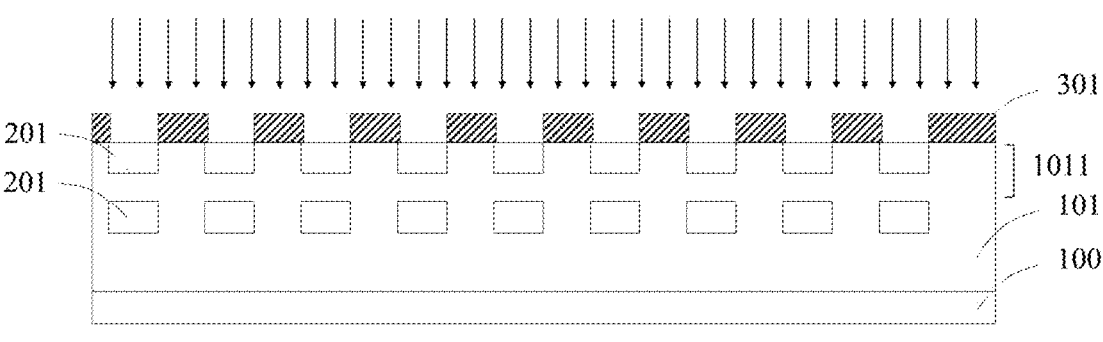
Figure 12:
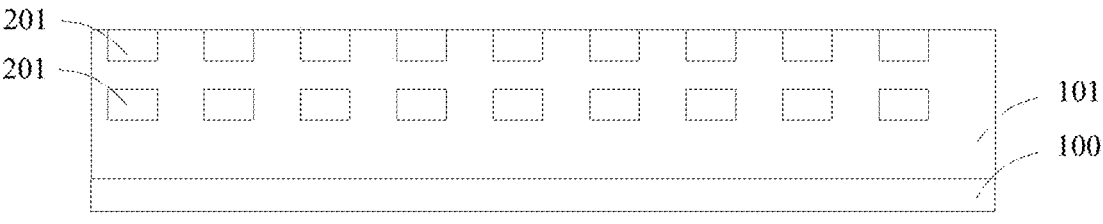

Step S023: conducting the ion implant process on the N-type layer 1011 by the first photoresist 301 to form a plurality of P-type regions 201, as shown in FIG. 11-12.

Figure 13:
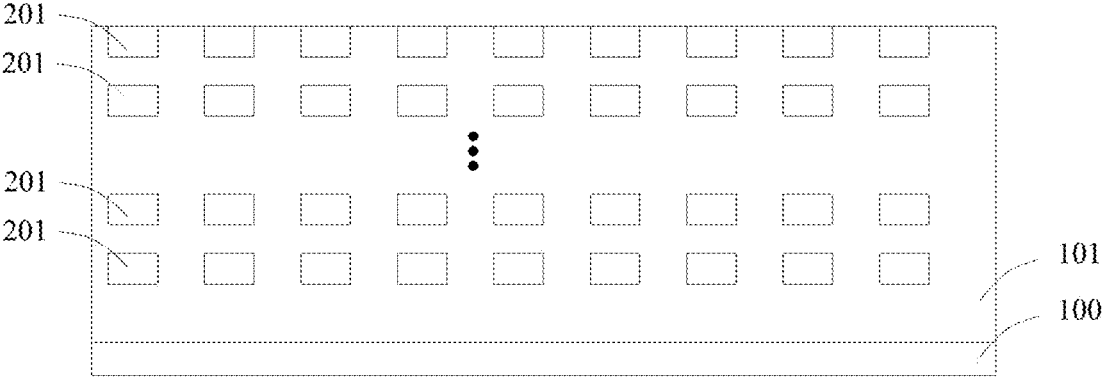

Step S024: repeating steps S022 and S023 for at least one time according to a desired length of the P-type pillars 202, as shown in FIG. 13.

Step S025: conducting a field oxidation to the P-type regions 201 to form the P-type pillars 202, as shown in FIG. 14.

Figure 15:
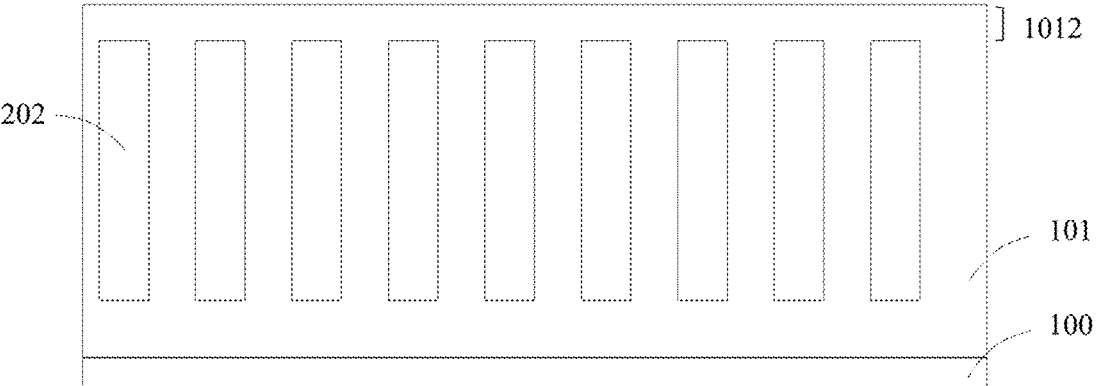

Step S03: depositing an N-type epitaxial layer 1012 on the P-type pillars 202, as shown in FIG. 15.

Figure 16:
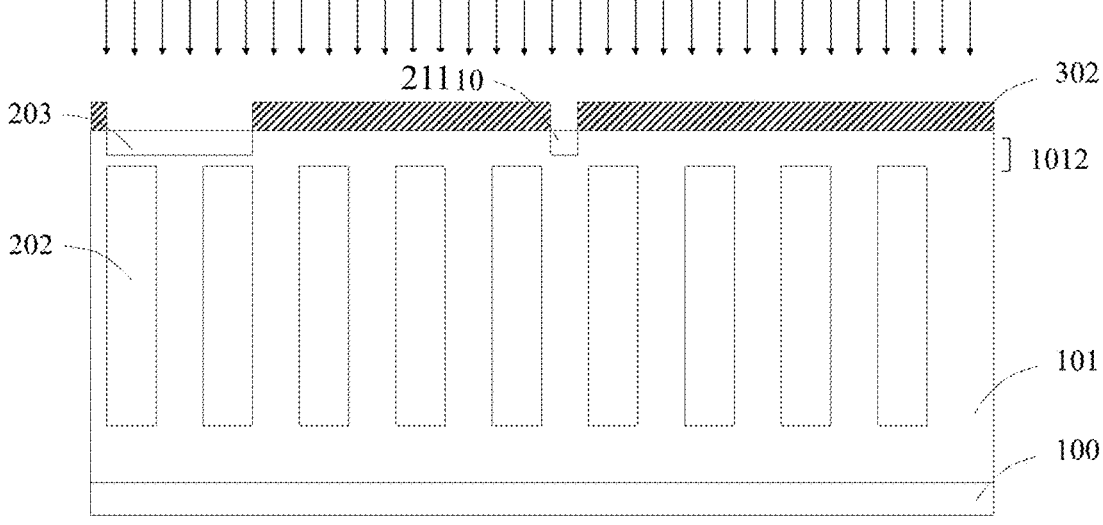

Step S04: conducting an ion implant process on the N-type epitaxial layer 1012 by a second photoresist 302 to form a first P-type epitaxial layer 203 and at least one localized P region 211, as shown in FIG. 16.

Figure 17:
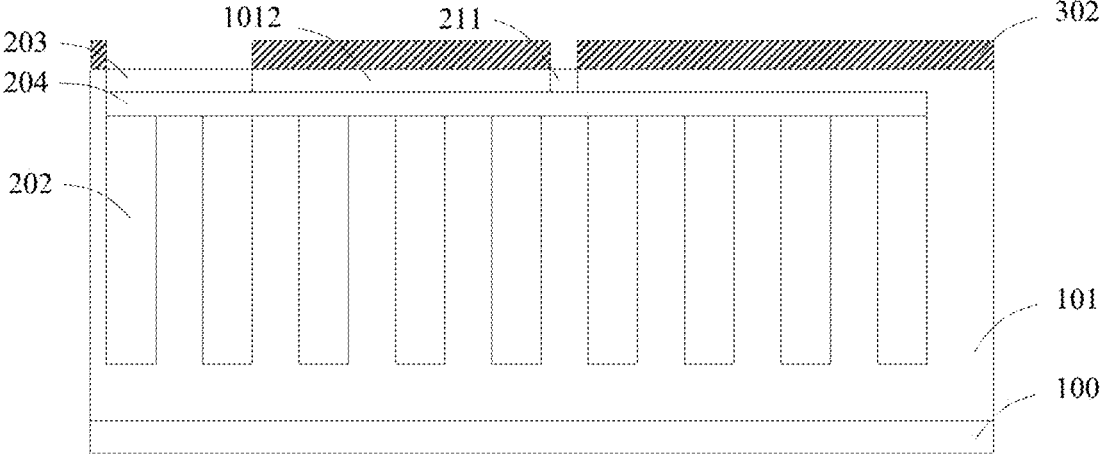
Figure 18:
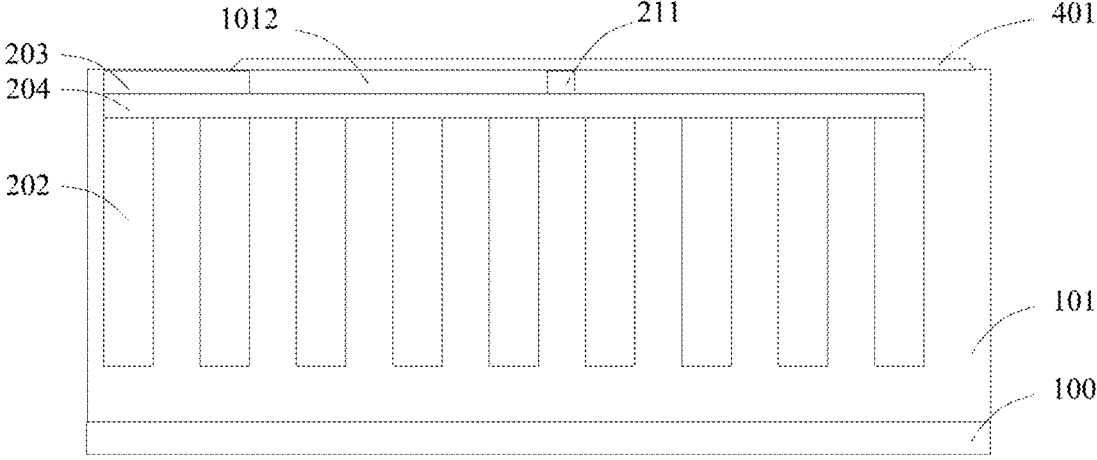

Step S05: conducting the field oxidation to the N-type epitaxial layer 1012 through the first P-type epitaxial layer 203 to form a second P-type epitaxial layer 204, as shown in FIG. 17. The field oxidation spreads from the first P-type epitaxial layer 203 to the end of the P-type pillars 202 or the end of the termination area TA.

Step S06: forming a field oxide layer 401 on the first P-type epitaxial layer 203 and the N-type epitaxial layer 1012, as shown in FIG. 17. The localized P region 211 passes though the N-type epitaxial layer 1012 to the field oxide layer 401.

Figure 5:
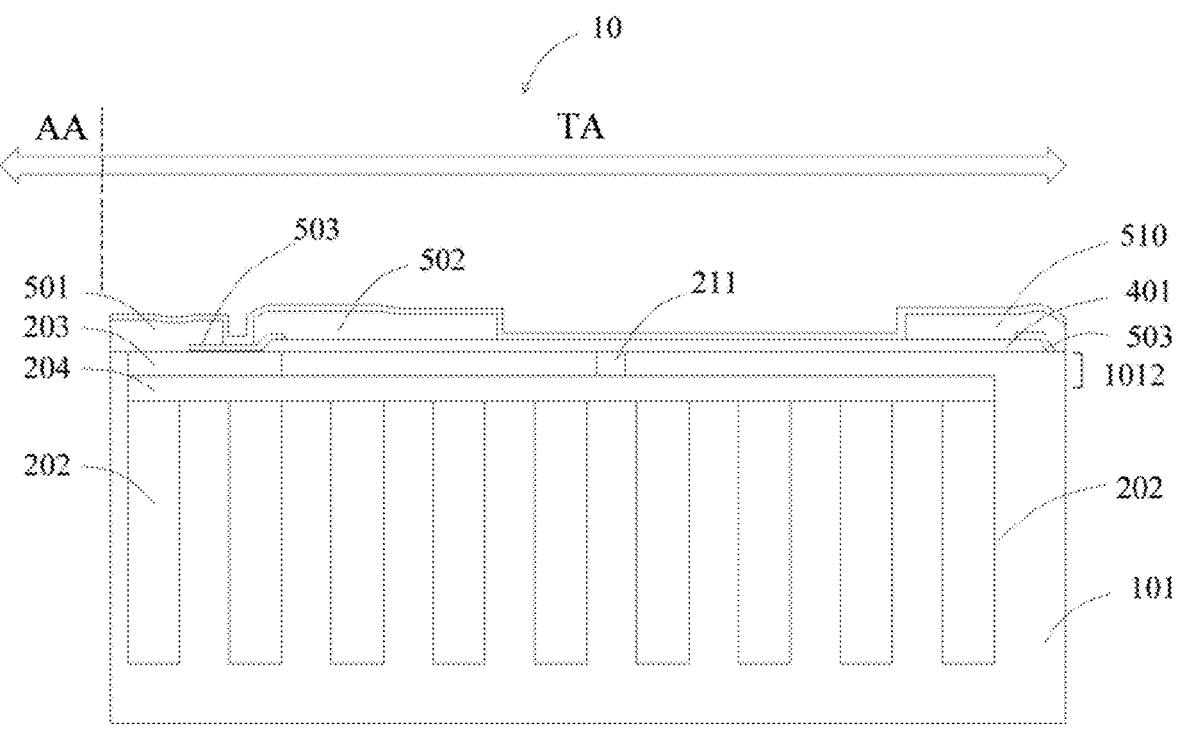
FIG. 5 is a cross-sectional view of the semiconductor device of FIG. 4 taken along line A-A' according to a first embodiment of the present disclosure.

Step S07: conducting a polysilicon deposition on the first P-type epitaxial layer 203 to form a polysilicon layer 503, wherein the polysilicon layer 503 abuts against the field oxide layer 401, as shown in FIG. 5.

Step S08: disposing a source electrode 501 on a side of the polysilicon layer 503, as shown in FIG. 5.

Step S9: disposing a gate electrode 502 disposed on another side of the polysilicon layer 503, as shown in FIG. 5.

Step S10: disposing an equipotential ring electrode 510 on the field oxide layer 401, as shown in FIG. 5.

In an embodiment of the present disclosure, steps S09-S11 may be incorporated into a single step by disposing the source electrode 501, the gate electrode 502, and the equipotential ring electrode 510 using a same metal layer.

Figure 4:
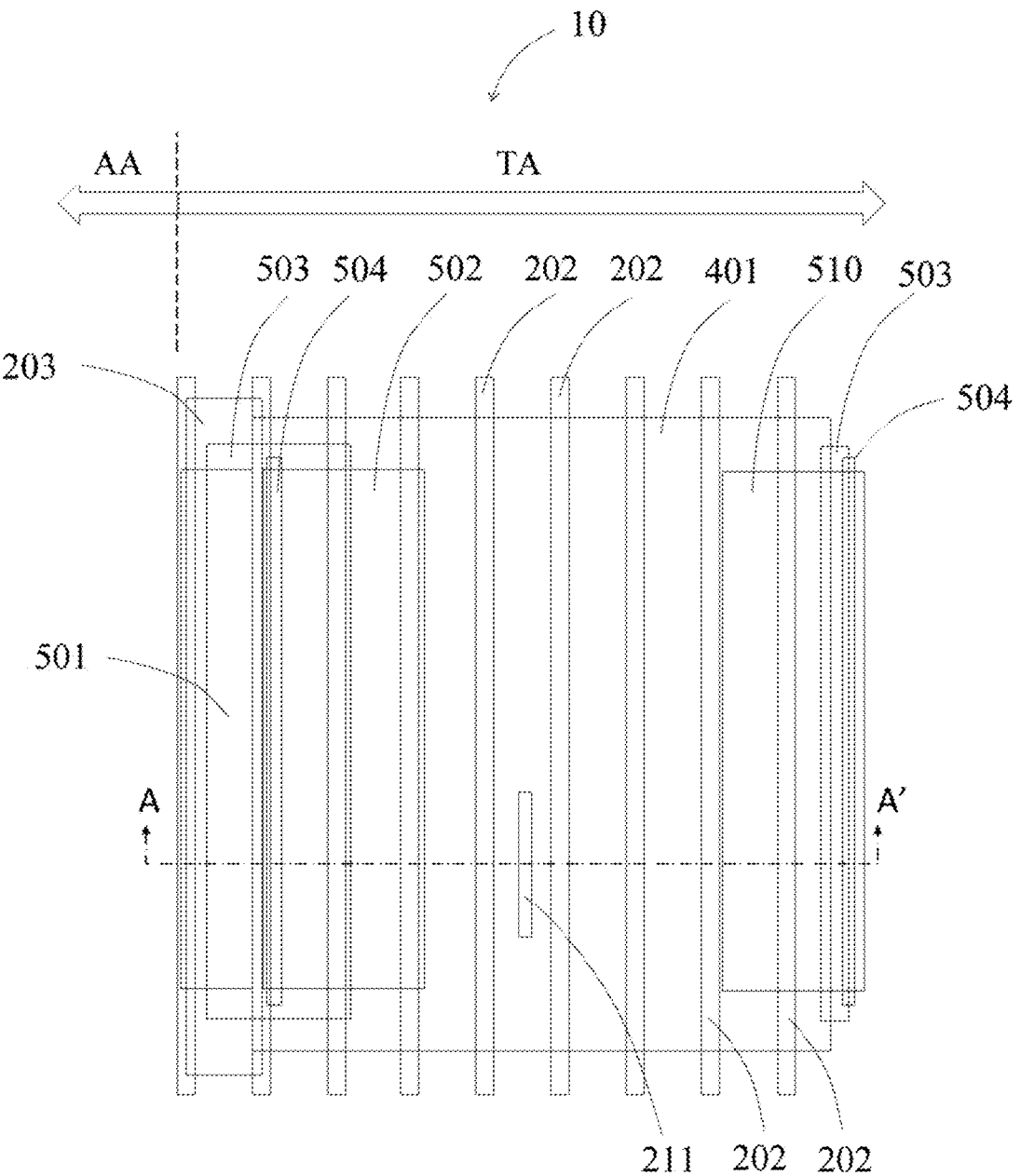
FIG. 4 is a top view of the semiconductor device in accordance with the embodiment of the present disclosure.

Please refer to FIG. 4 which is a top view of the semiconductor device in accordance with the embodiment of the present disclosure.

As shown in FIG. 4, the present disclosure further provides a semiconductor device including an active area AA and a termination area TA surrounding the active area AA. The termination area TA includes an N-drift layer 101, a plurality of P-type pillars 202, a first P-type epitaxial layer 203, a second P-type epitaxial layer 204, an N-type epitaxial layer 1012, a field oxide layer 401, at least one localized P region 211, a polysilicon layer 503, a source electrode 501, a gate electrode 502, and an equipotential ring.

The N-drift layer 101 is disposed on a substrate 100 and is N-type doped through an ion implantation process known in the art. The N-drift layer 101 may have a doping concentration ranging from about $1\times10^{15}$ atoms/cm$^3$ to about $1\times10^{17}$ atoms/cm$^3$. The N-drift layer 101 is subjected to an ion implantation process known in the art by using a first photoresist 301 to form a plurality of P-type pillars 202 thereon. The P-type pillars 202 may have a doping concentration ranging from about $1\times10^{15}$ atoms/cm$^3$ to about $1\times10^{17}$ atoms/cm$^3$. The first photoresist 301 serves as a mask during the ion implantation process.

The second P-type epitaxial layer 204 is disposed on the P-type pillars 202. The second P-type epitaxial layer 204 connects to the P-type pillars 202 and covers at about 50%-100% of a surface area of the P-type pillars 202.

The N-type epitaxial layer 1012 is disposed on the second P-type epitaxial layer 204 through the ion implantation process. The N-type epitaxial layer 1012 may be formed by the same process and material as the N-drift layer 101 and the N-type layer 1011, thereby the N-type epitaxial layer 1012, the N-type layer 1011, and the N-drift layer 101 are integrated into a unified whole. The N-type epitaxial layer 1012 is subjected to the ion implantation process by a second photoresist 302 to form the first P-type epitaxial layer 203 and at least one localized P region 211.

A width of the first P-type epitaxial layer 203 is greater than a width of a P-type pillar such that the first P-type epitaxial layer 203 overlaps a portion of the P-type pillars 202. The localized P region 211 is disposed on the second P-type epitaxial layer 204 along a longitudinal direction of one of the P-type pillars 202. For convenience of presentation, the localized P region 211 is disposed between two of the P-type pillars 202 in FIG. 4. The localized P region 211 may also cover at least one of the P-type pillars 202, which is not limited herein.

The first P-type epitaxial layer 203 is disposed on and abuts against the N-type epitaxial layer 1012. The first P-type epitaxial layer 203 and the localized P region 211 can be formed by the same process and material as the P-type pillars 202.

The field oxide layer 401 is disposed on the first P-type epitaxial layer 203, the localized P region 211, and the N-type epitaxial layer 1012 by an oxidation process and an anneal process known in the art. The field oxide layer 401 may include silicon dioxide or other dielectric material. The field oxide layer 401 is electrically connected to the second P-type epitaxial layer 204 by the localized P region 211, thereby extending the surface electric field of the field oxide layer 401 to the end of the second P-type epitaxial layer 204. Therefore, the depletion boundary of the surface electric field of the semiconductor device is extended.

The polysilicon layer 503 is disposed on the first P-type epitaxial layer 203, wherein the polysilicon layer 503 abuts against the field oxide layer 401.

The source electrode 501 is disposed on and connects to a side of the polysilicon layer 503. The gate electrode 502 is disposed on and connected to another side of the polysilicon layer 503 by a contact layer. The equipotential ring electrode 510 is disposed on and connected to the field oxide layer 401 by the contact layer. The source electrode 501, the gate electrode 502, and the equipotential ring electrode 510 can be made of the same metal. Examples of metal layer 25 include conductive materials like Aluminum (Al), Chrome (Cr), Copper (Cu), Nickel (Ni), Gold (Au), etc.

The number of the localized P region 211 is definable by the following in equations:

(A) number of localized P regions/number of P-type pillars <1;

(B) electric field of having localized P region/electric field of not having localized P region <1; and (C) (number of localized P regions/number of P-type pillars)×1/(electric field of having localized P region/ electric field of not having localized P region)

Embodiment 1

FIG. 5 is a cross-sectional view of the semiconductor device of FIG. 4 taken along line A-A' according to a first embodiment of the present disclosure. In the present embodiment, one localized P region 211 is disposed on a side of the termination area TA.

Embodiment 2

Figure 6:
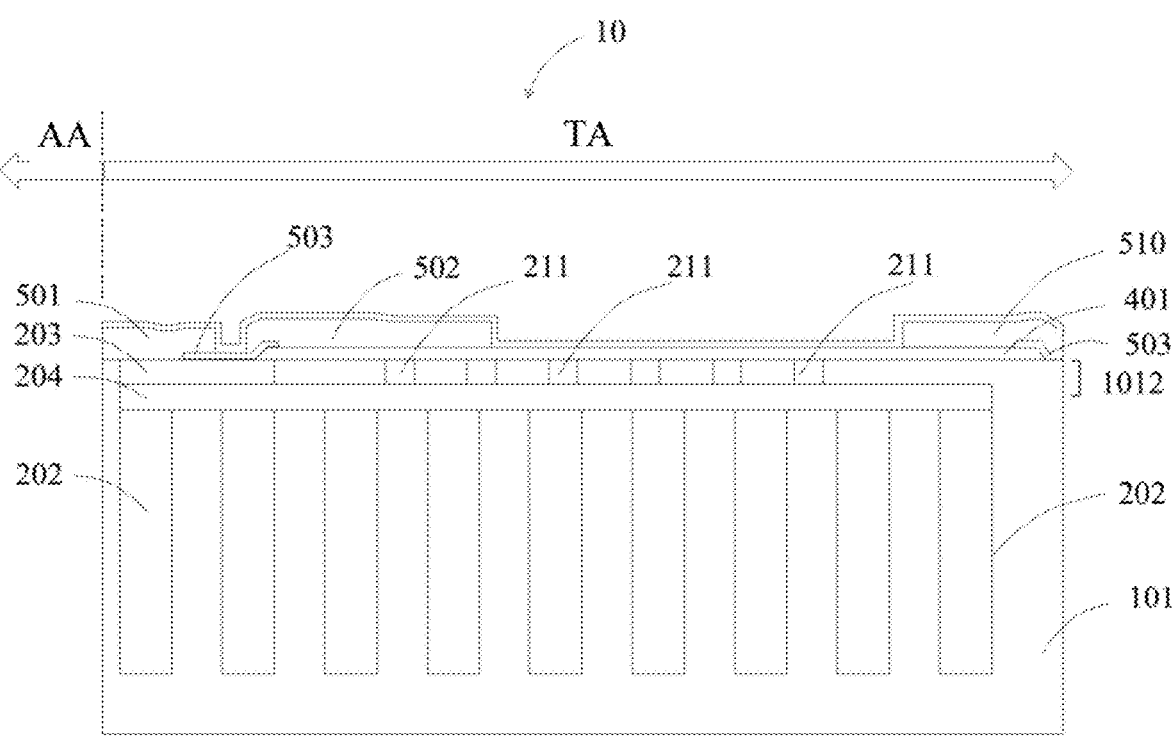
FIG. 6 is a cross-sectional view of the semiconductor device taken along line A-A' according to a second embodiment of the present disclosure.

FIG. 6 is a cross-sectional view of the semiconductor device taken along line A-A' according to a second embodiment of the present disclosure. Embodiment 1 and Embodiment 2 share the same elements, which are not repeated herein. The difference between Embodiment 1 and Embodiment 2 is that six localized P regions 211 are disposed on the side of the termination area TA.

Please refer to FIGS. 19A-19D, which are schematic diagrams illustrating a depletion boundary at the surface electric field of the power semiconductor devices in accordance with some embodiment of the present disclosure.

FIG. 19A shows a schematic diagram of a first comparative embodiment in which no localized P region 211 is disposed on the termination area TA. The breakdown voltage of the first comparative embodiment is 703V. The depletion boundary of the surface electric field of the comparative embodiment is denoted by a dash line. The reverse blocking voltage capability is shown by the grey/white gradient. The wider of the grey/white gradient indicates the greater of the reverse blocking voltage capability. FIG. 19B shows a schematic diagram of the first embodiment in which one localized P region 211 is disposed on the termination area TA. The breakdown voltage of the first comparative embodiment is 705V. The depletion boundary and the reverse blocking voltage capability of the surface electric field of the first embodiment is greater than that of the comparative embodiment. FIG. 19C shows a schematic diagram of the second embodiment in which six localized P regions 211 are disposed on the termination area TA. The breakdown voltage of the first comparative embodiment is 709V. The depletion boundary and the reverse blocking voltage capability of the surface electric field of the second embodiment is greater than that of both the comparative embodiment and the first embodiment. FIG. 19D shows a schematic diagram of the second comparative embodiment in which the localized P regions 211 almost covers the whole termination area TA. The breakdown voltage of the first comparative embodiment is greatly reduced to 191V. Although the depletion boundary of the surface electric field of the first embodiment is greater than other embodiments, the reverse blocking voltage capability is greatly reduced which lose the function of preventing current from flowing from the output to the input side.

Figure 20:
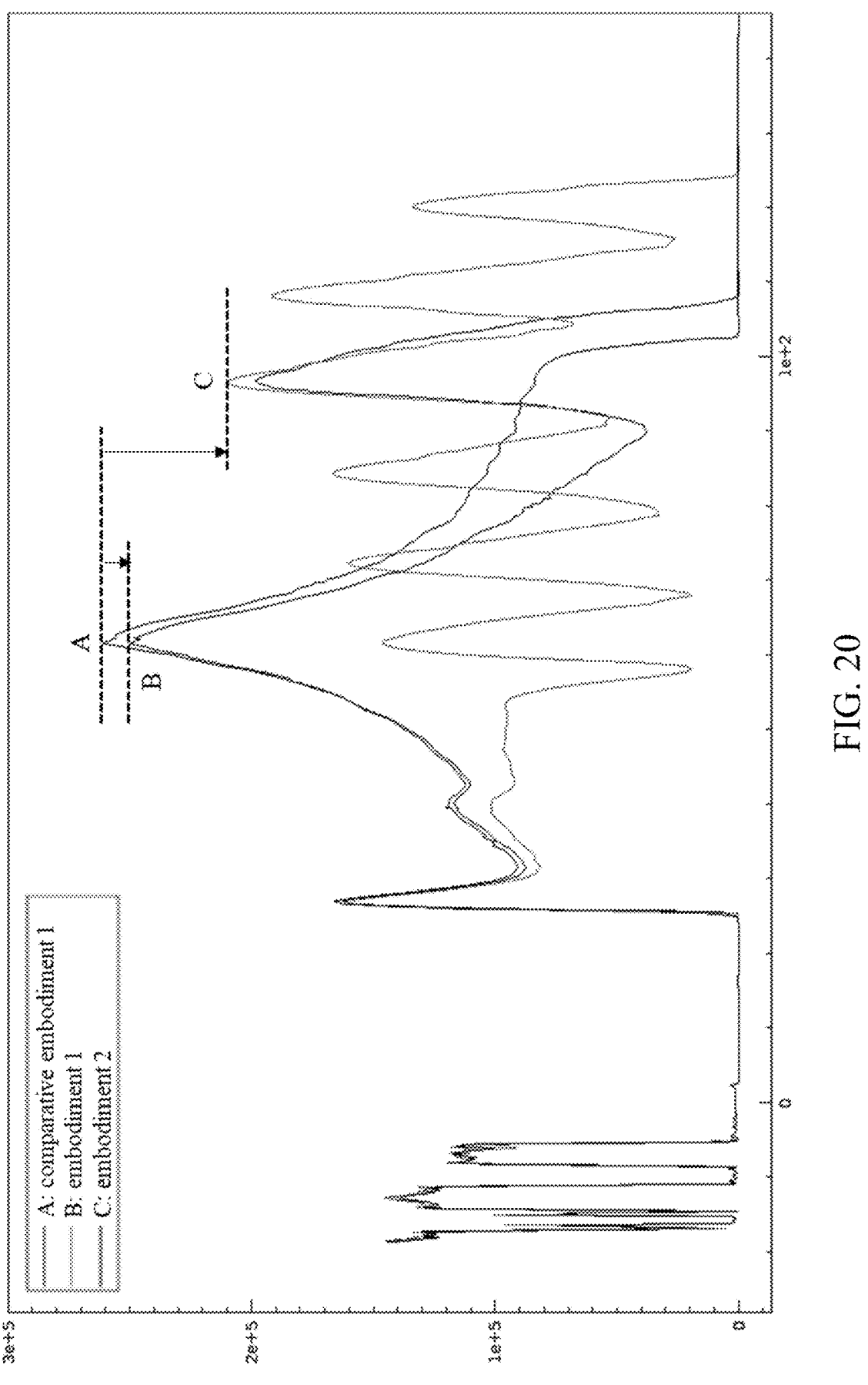
FIGS. 20-21 are schematic diagrams illustrating highest peaks of the surface electric field of the power semiconductor devices in accordance with some embodiment of the present disclosure.
Figure 21:
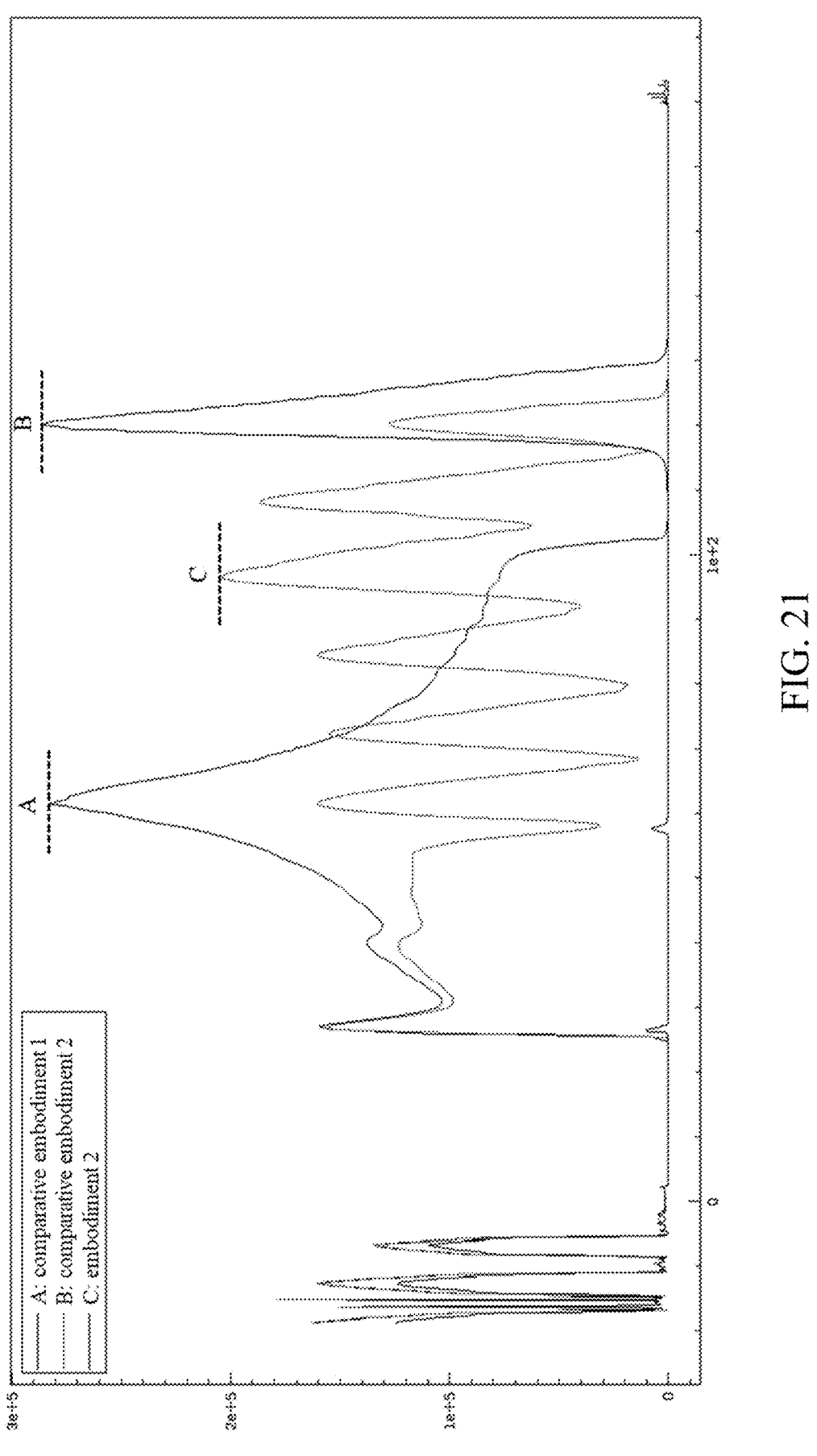

Please refer to FIGS. 20-21, which are schematic diagrams illustrating highest peaks of the surface electric field of the power semiconductor devices in accordance with some embodiment of the present disclosure. The X-axis indicates the distance of the cross section of the termination area TA, while the Y-axis indicates the surface electric field. As shown in FIG. 20, the highest peak of the first comparative embodiment is $2.6\times10^5$ V/cm. Owing to the localized P region 211, the highest peak of the first embodiment is reduced to $2.5\times10^5$ V/cm, and the highest peak of the second embodiment is greatly reduced to $2.1\times10^5$ V/cm. The distribution of the peaks disperses and achieves a uniform surface electric field. The surface electric field can be reduced by adding localized surface P region. Lower surface electrical field gains better immunity of technology process, hence more reliable and stable. As shown in FIG. 21, the highest peak of the second comparative embodiment is $2.7\times10^5$ V/cm which is the highest of other embodiment.

In summary, the beneficial effects of the present disclosure are as follows: the semiconductor device and the manufacturing method of the present disclosure are provided with a termination area in which a localized P region is disposed and passes through an N-type epitaxial layer to a field oxide layer. Owing to the localized P region, the semiconductor device of the present disclosure is capable of extending a depletion boundary of a surface electric field of the semiconductor device and reducing peaks of the surface electric field, thereby achieving a uniform electric field distribution and increasing breakdown voltage. The reverse blocking voltage capability is also increased. More robust to high temperature reverse bias reliability test due to lower surface electric field. Because the electric potential distribution is related to the electric field, the electric potential distribution of the semiconductor device of the present disclosure is increased. Lower surface electric field can gain greater immunity to the technology processes so the stability of the semiconductor device of the present disclosure is increased. The localized P region can be well controlled by various pattern to achieve the desired performance. Moreover, the localized P region can be formed by reusing the photoresist without using any additional photoresist, which omits manufacturing costs.

The present disclosure disclosed herein has been described by means of specific embodiments. However, numerous modifications, variations and enhancements can be made thereto without departing from the spirit and scope of the disclosure set forth in the claims.

What is claimed is:

1. A manufacturing method of a semiconductor device, comprising steps of:
   depositing an N-drift layer on a termination area of a substrate;
   conducting an ion implant process on the N-drift layer to form a plurality of P-type pillars;
   depositing a N-type epitaxial layer on the P-type pillars;
   conducting an ion implant process on the N-type epitaxial layer to form a first P-type epitaxial layer and at least one localized P region at a front side of the termination area;
   conducting a field oxidation to the first P-type epitaxial layer to form a second P-type epitaxial layer, the field oxidation spreads from the first P-type epitaxial layer to the end of the P-type pillars to form the second P-type epitaxial layer; and
   forming a field oxide layer on the first P-type epitaxial layer, the localized P region and the N-type epitaxial layer; wherein the localized P region passes though the N-type epitaxial layer to the field oxide layer, the field oxide layer electrically connects to the second P-type epitaxial layer by the localized P region;
   conducting a polysilicon deposition on the first P-type epitaxial layer to form a polysilicon layer at the front side of the termination area, wherein the polysilicon layer abuts against the field oxide;
   disposing a source electrode on a side of the polysilicon layer and the first P-type epitaxial layer, wherein the first P-type epitaxial layer extends from the source electrode;
   disposing a gate electrode disposed on another side of the polysilicon layer.

2. The manufacturing method of claim 1, wherein the step of conducting the ion implant process on the N-drift layer to form the plurality of P-type pillars comprises a step of: conducting the ion implant process on the N-drift layer to form a plurality of P-type regions.

3. The manufacturing method of claim 2, wherein the step of conducting the ion implant process on the N-drift layer to form the plurality of P-type pillars further comprises steps of:
   (a) depositing a N-type layer on the P-type regions;
   (b) conducting the ion implant process on the N-type layer to form the P-type regions;
   (c) repeating steps (a)-(b) for at least one time;
   (d) conducting a field oxidation to the P-type regions to form the P-type pillars.

4. The manufacturing method of claim 1, wherein the localized P region is formed on the second P-type epitaxial layer along a longitudinal direction of one of the P-type pillars.

5. The manufacturing method of claim 1, wherein each of the localized P region is spaced apart from each other.

6. The manufacturing method of claim 1, wherein a ratio of the localized P region to the P-type pillars is 1:3-100.

7. The manufacturing method of claim 1, further comprising a step of electrically conducting the semiconductor device, wherein a peak of a surface electric field of the semiconductor device is approximately equal to or less than $2.1 \times 10^5$ V/cm.

8. The manufacturing method of claim 1, further comprising a step of electrically conducting the semiconductor device, wherein a breakdown voltage of the semiconductor device is approximately equal to or greater than 1.05 times to device sustained breakdown voltage rating.

9. The manufacturing method of claim 1, further comprising steps of:

disposing an equipotential ring electrode on the field oxide.

\* \* \* \* \*